United States Patent [19]

Willis

[11] 4,101,815
[45] Jul. 18, 1978

[54] HORIZONTAL DEFLECTION CIRCUIT WITH HIGH VOLTAGE SELECTION CAPABILITY

[75] Inventor: Donald Henry Willis, Indianapolis, Ind.

[73] Assignee: RCA Corporation, New York, N.Y.

[21] Appl. No.: 796,671

[22] Filed: May 13, 1977

[51] Int. Cl.² ............................................. H01J 29/80
[52] U.S. Cl. ..................................... 315/411; 358/243
[58] Field of Search ........................ 315/411; 358/243

[56] References Cited

U.S. PATENT DOCUMENTS

| | | | |
|---|---|---|---|
| 3,649,901 | 3/1972 | Waltner | 315/411 |
| 3,706,023 | 12/1972 | Yamada et al. | 315/411 |
| 3,840,784 | 10/1974 | Schauffele | 358/243 X |
| 3,881,135 | 4/1975 | Dietz | 315/411 X |
| 3,885,198 | 5/1975 | Pritchard et al. | 315/411 |
| 4,013,923 | 3/1977 | Hollander | 315/411 |

*Primary Examiner*—Malcolm F. Hubler
*Attorney, Agent, or Firm*—Eugene M. Whitacre; Paul J. Rasmussen; Joseph Laks

[57] ABSTRACT

A television receiver circuit includes a voltage regulator with a feedback circuit for providing a regulated B+ operating voltage, a horizontal deflection circuit including a resonant retrace circuit for generating a scanning current in a deflection winding for producing a raster, a high voltage circuit for providing an ultor voltage for beam current, and a high voltage protection circuit for disabling normal operation of the horizontal deflection circuit when the ultor voltage exceeds a predetermined magnitude. An impedance is included and is capable of being selectively coupled to the feedback circuit. A capacitance is also included and is capable of being selectively coupled to the resonant retrace circuit. Both means combined are selectively capable of decreasing the ultor voltage for preventing unnecessary disabling of the horizontal deflection circuit while maintaining a constant raster width.

20 Claims, 1 Drawing Figure

U.S. Patent
July 18, 1978
4,101,815
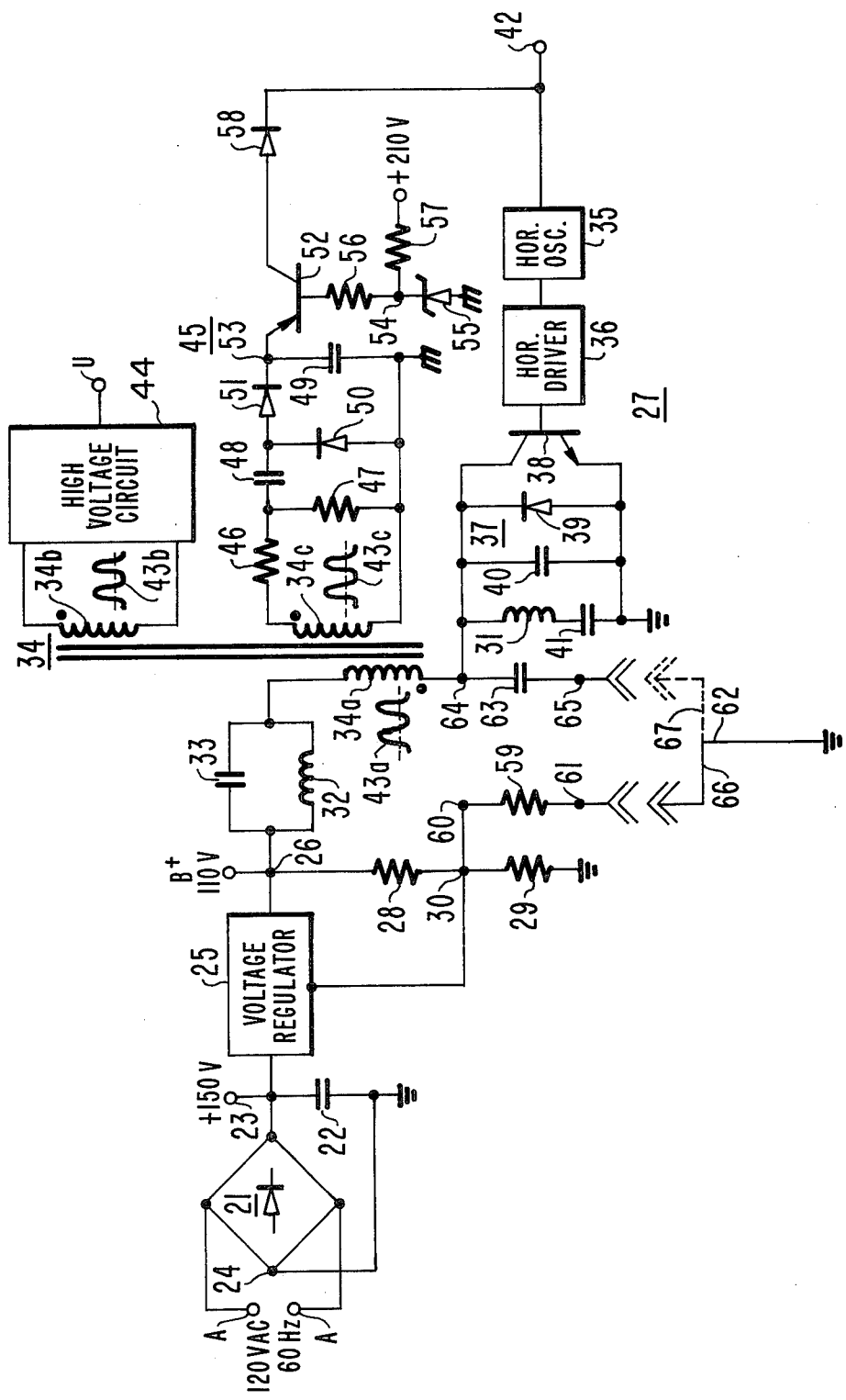

HORIZONTAL DEFLECTION CIRCUIT WITH HIGH VOLTAGE SELECTION CAPABILITY

BACKGROUND OF THE INVENTION

This invention relates to horizontal deflection circuits.

In television receivers, the ultor high voltage accelerating potential for beam current in many instances is derived at least in part from horizontal retrace pulses appearing across a tertiary winding of a horizontal output transformer. For transistorized horizontal deflection circuits, the magnitude of the retrace pulses and thus the magnitude of the high voltage is a function of both the B+ operating voltage supplied to the horizontal deflection circuit and of the parameters of the resonant retrace circuit formed by the total retrace capacitance and inductance in resonance. A decrease in either B+ voltage or resonant frequency will tend to reduce the retrace pulse magnitude and thus reduce the high voltage.

The width of each raster line is proportional to the peak-to-peak trace current and is inversely proportional to the square root of the high voltage. A decrease in B+ voltage will proportionally decrease both peak-to-peak trace current and high voltage. However, since raster width is inversely proportional to the square root of the high voltage, a decrease in B+, without further compensation, will produce a decrease in raster width and possibly also an undesirable visible underscan condition.

To protect against exposure to harmful X-radiation, many television receivers include a high voltage protection circuit for sensing the high voltage and disabling normal operation of the horizontal deflection circuit if the high voltage increases above a predetermined value. The tripping voltage, or value of high voltage above which the protection circuit will disable the horizontal deflection circuit, is selected low enough so that the disabling will occur well before any harmful radiation is produced under all beam loading and other environmental conditions.

Manufacturing tolerances in the production of the electrical components comprising the protection circuit will produce some variation in the value of the tripping voltage from one assembled television receiver to another. In some assembled receivers, the deviation of the component values are such as to decrease the tripping voltage to a point that nuisance tripping will occur, that is, during operation of the television receiver, disabling of the horizontal deflection circuit will occur even though no possibility exists for generating harmful X-radiation.

It is desirable, therefore, to design a horizontal deflection circuit such that by means of simple corrective steps, nuisance tripping can be eliminated from those receivers subject to such a problem. A feature of the invention is to eliminate the nuisance tripping by decreasing the B+ operating voltage. To maintain a constant raster width, the circuit values in the horizontal deflection circuit should also be changed. The basic operation of the horizontal deflection circuit, however, should remain unchanged. The corrective steps to be taken should require much less effort than that of replacing all of the high voltage protection circuit components that produced the nuisance tripping condition.

SUMMARY OF THE INVENTION

A deflection circuit comprises a voltage regulator responsive to a source of unregulated voltage for providing an operating voltage at an output terminal, a deflection winding, a deflection circuit coupled to the deflection winding for generating scanning current in the deflection winding for producing a raster, and a high voltage circuit for providing a high voltage accelerating potential for beam current. The deflection circuit includes a capacitance coupled to the deflection winding for forming a resonant circuit therewith.

A first apparatus is coupled to the voltage regulator for selectively changing the magnitude of the operating voltage, and a second apparatus is coupled to the resonant circuit for selectively changing the resonant frequency. The first and second apparatus combine selectively to decrease the magnitude of the high voltage accelerating potential while maintaining a constant raster width.

BRIEF DESCRIPTION OF THE DRAWING

The FIGURE is an illustration of a horizontal deflection circuit embodying the invention.

DESCRIPTION OF THE INVENTION

In the FIGURE, 120 volt, 60 hertz, AC line voltage at terminals A-A is coupled to a full wave bridge rectifier 21. A filter capacitor 22 is coupled between an output terminal 23 and a return terminal 24 of rectifier 21, the return terminal 24 being designated as a nonisolated ground reference terminal. A filtered but unregulated DC voltage is provided at output terminal 23, illustratively shown as +150 volts. Terminal 23 is coupled to a voltage regulator 25. An output terminal 26 provides a regulated B+ operating voltage to a horizontal deflection circuit 27, the B+ operating voltage illustratively shown as +110 volts. Regulation against output and line variations is achieved by coupling to regulator 25 a negative feedback voltage obtained from a voltage divider comprising feedback resistors 28 and 29, the feedback voltage being derived at a terminal 30, the junction of resistors 28 and 29.

The B+ operating voltage is coupled to a horizontal deflection winding 31 through a high voltage tuning circuit comprising a parallelly coupled inductor 32 and a capacitor 33, and then through a primary winding 34a of a horizontal output transformer 34. Horizontal deflection circuit 27 includes a horizontal oscillator 35, a horizontal driver 36 for providing horizontal drive signals, and a transistorized horizontal output circuit 37. Horizontal output circuit 37 comprises a horizontal output transistor 38, damper diode 39, retrace capacitor 40 and a series coupled horizontal deflection winding 31 and an "S" shaping capacitor 41. Synchronized scan is achieved by coupled a control voltage to an input terminal 42 of horizontal oscillator 35 from an automatic frequency and phase control circuit, not shown. The trace and retrace voltage 43a appearing across primary winding 34a are transformed by a tertiary winding 34b and rectified by a high voltage circuit 44 to provide an ultor high voltage accelerating potential for beam current at a terminal U.

A high voltage protection circuit 45 is coupled to horizontal output transformer 34. High voltage protection circuit 45 senses the high voltage and disables the normal operation of horizontal deflection circuit when the high voltage exceeds a predetermined tripping voltage for preventing the production of harmful X-radiation. The voltage across primary winding 34a is transformed by a secondary winding 34c into trace and retrace voltage 43c with one end of secondary winding 34c being designated as an isolated ground. A voltage divider comprising resistors 46 and 47 is coupled across winding 34c. A peak-to-peak detector comprising capacitors 48 and 49 and appropriately poled diodes 50 and 51 is coupled to the junction of voltage dividing resistors 46 and 47. A voltage proportional to the peak-to-peak excursion of voltage 43c is obtained from diode 51 at a terminal 53 and is coupled to the emitter of a comparator transistor 52. A reference voltage obtained at a terminal 54 is established by a temperature stable reference diode 55, and is coupled to the base of transistor 52 through a resistor 56. Terminal 54 is coupled to a +210V supply through a resistor 57. The collector of transistor 52 is coupled to input terminal 42 of horizontal oscillator 35 through a diode 58.

The voltage at the emitter of transistor 52 is representative of the high voltage at the ultor terminal U. An increase in high voltage will result in an increase in the voltage level at terminal 53. By appropriate selection of the values of the components of high voltage protection circuit 45, when the high voltage increases beyond a predetermined value — beyond the tripping voltage — the voltage at terminal 53 will be one $V_{be}$ greater than the reference voltage at terminal 54, thereby biasing transistor 52 into conduction. When transistor 52 conducts, the voltage at terminal 53 is coupled to input terminal 42 of horizontal oscillator 35, greatly increasing the frequency of operation of oscillator 35, disabling normal operation of the horizontal deflection circuit, creating an unviewable raster, and decreasing the high voltage, thereby providing protection against the generation of harmful X-radiation.

Because of component value variability from one assembled television receiver to another, due in part to such factors as manufacturing tolerances of circuit components and temperature variations of component values, a given voltage at terminal 53 will represent, from one receiver to another, slightly different high voltage values of the ultor terminal U. Thus, the tripping voltage for disabling normal operation will also vary from one receiver to another.

Occasionally, because of the variability in tripping voltage, the tripping voltage of a particularly assembled television receiver will be so low as to cause disabling of the horizontal deflection circuit even though the high voltage is too low to generate any harmful X-radiation. If the design of the receiver circuits does not permit easy solution to the problem of such nuisance tripping, costly and time consuming replacement of component parts will be required. A feature of the invention is the design of the television circuits in such a manner that, should corrective steps be required to eliminate the problem of nuisance tripping, they may be readily undertaken with a minimum of time consuming effort and without undesirably affecting operation of the horizontal deflection circuit.

An impedance element, resistor 59, has a terminal 60 coupled to terminal 30, the junction of feedback resistors 28 and 29. A second terminal 61 of resistor 59 is so constructed as to permit selective coupling and decoupling of the resistor to the non-isolated ground. Such a selective operation may be provided through use of a jumper cable 62.

An energy storage capacitor 63 has a terminal 64 coupled to the junction of primary winding 34a and horizontal deflection winding 31. A second terminal 65 of capacitor 63 is so constructed as to permit selective coupling and decoupling of the capacitor to the nonisolated ground. Such a selective operation may be conveniently provided by the same jumper cable 62.

The normal procedure of television receiver assembly will locate jumper cable 62 in position 66, coupling resistor 59 to ground. The feedback voltage at terminal 30 will be a function of the series combination of resistor 28 and the parallel resistance of resistors 29 and 59. Capacitor 63 is decoupled from ground and is not included in the total retrace capacitance of horizontal output circuit 37.

If a television receiver, after assembly, is found to be subject to the above-described nuisance tripping, corrective measures may be readily taken. Jumper cable 62 is relocated to position 67 decoupling resistor 59 from ground and coupling capacitor 63 to ground. The feedback voltage, now being a function only of resistors 28 and 29, is of greater magnitude than previously. Then, because of negative feedback, the B+ operating voltage at terminal 26 will decrease, thereby causing a decrease in high voltage at the ultor.

If the decrease in B+ operating voltage were not accompanied by other circuit changes, raster width would undesirably decrease, as mentioned previously. However, because the circuit design permits coupling of capacitor 63 into output circuit 37 when resistor 59 is decoupled from ground, the B+ operating voltage can be decreased, and, at the same time, the raster width can be maintained constant. When capacitor 63 is coupled to ground, the total retrace capacitance increases, the resonant retrace frequency decreases, decreasing the magnitude of the horizontal retrace pulses, further decreasing the high voltage. A decrease in high voltage caused by decreasing the resonant retrace frequency tends to increase the raster width, compensating for the previous decrease in raster width caused by the decrease in B+ operating voltage.

The values for resistor 59 and capacitor 63 are selected to provide for total decrease in high voltage sufficient to eliminate nuisance tripping by high voltage protection circuit 45 and, at the same time, maintain constant raster width. Thus, with the advantageous circuit design of the FIGURE, nuisance tripping may be eliminated by a single, quick, and cost effective step without undesirably affecting other circuit operations.

What is claimed is:

1. A circuit comprising:
    a voltage regulator responsive to a source of unregulated voltage for providing an operating voltage at an output terminal;
    a deflection winding;
    a deflection circuit coupled to said deflection winding for generating scanning current in said deflection winding for producing a raster, said deflection circuit including a capacitance coupled to said deflection winding for forming a resonant circuit therewith;
    high voltage means coupled to said deflection circuit for providing a high voltage accelerating potential for beam current;
    a high voltage protection circuit coupled to said deflection circuit and responsive to said high voltage accelerating potential for disabling normal operation of said deflection circuit when said high voltage accelerating potential exceeds a predetermined magnitude;

first means coupled to said voltage regulator for selectively changing the magnitude of said operating voltage; and second means coupled to said resonant circuit for selectively changing the resonant frequency of said resonant circuit, said first and second means combined selectively for decreasing the magnitude of said high voltage accelerating potential for preventing unnecessary disabling of normal operation of said deflection circuit by said high voltage protection circuit while maintaining a constant raster width.

2. A circuit according to claim 1, wherein a first terminal of each of said first and second means is constructed in a manner capable of being selectively coupled to a common terminal.

3. A circuit according to claim 1 wherein said voltage regulator includes feedback means responsive to said operating voltage for providing a feedback voltage for regulating said operating voltage, said first means includes a second terminal coupled to said feedback means.

4. A circuit according to claim 3 wherein said feedback means comprises a voltage divider.

5. A circuit according to claim 4 wherein said first means comprises a resistor.

6. A circuit according to claim 1 wherein said deflection circuit comprises a horizontal deflection circuit including a horizontal output transformer coupled to said deflection winding, a first secondary winding of said transformer coupled to said high voltage means.

7. A circuit according to claim 6 wherein said horizontal deflection circuit includes a horizontal output transistor and a damper diode coupled to said horizontal output transistor.

8. A circuit according to claim 6 wherein said high voltage protection circuit comprises:

a second secondary winding coupled to said horizontal output transformer;

sensing means responsive to a voltage developed with said second secondary winding for developing a first voltage representative of at least one peak excursion of said voltage developed within said second secondary winding;

comparison means coupled to said sensing means for comparing said first voltage with a reference voltage for providing a disabling signal; and means for coupling said disabling signal to said deflection circuit.

9. A circuit according to claim 8 wherein said sensing means comprises a peak-to-peak detector.

10. A circuit according to claim 9 including a voltage divider coupled to aid second secondary winding, said sensing means coupled to a junction point of said voltage divider.

11. A horizontal deflection circuit comprising:

a voltage regulator responsive to a source of unregulated voltage for providing an operating voltage;

feedback means coupled to said voltage regulator and responsive to said operating voltage for providing said voltage regulator with a feedback voltage for regulating said operating voltage;

a horizontal deflection winding;

a horizontal output circuit coupled to said horizontal deflection winding for providing scanning current to said horizontal deflection winding for generating a raster, said horizontal output circuit including a resonant retrace circuit for generating retrace signals;

high voltage means coupled to said horizontal output circuit and responsive at least to said retrace signals for providing a high voltage accelerating potential;

a reference terminal;

impedance means including first and second terminals, said first terminal coupled to said feedback means, said impedance means changing said feedback voltage when said second terminal is coupled to said reference terminal for changing said operating voltage;

energy storage means including third and fourth terminals, said third terminal coupled to said resonant retrace circuit, said energy storage means changing the magnitude of said retrace signals for adjusting the width of said raster when said fourth terminal is coupled to said reference terminal, said second, fourth and reference terminals constructed to permit selective coupling of said reference terminal to either one of said second and fourth terminals for selectively changing said operating voltage while maintaining the width of said raster substantially constant.

12. A circuit according to claim 11 wherein said selective coupling is accomplished by means of a jumper wire.

13. A circuit according to claim 11 wherein said feedback means comprises a voltage divider, said impedance means coupled to a junction terminal of said voltage divider.

14. A circuit according to claim 13 wherein said energy storage means comprises a capacitor.

15. A circuit according to claim 14 wherein said impedance means comprises a resistor.

16. A circuit according to claim 11, including:

horizontal oscillator and driver means coupled to said horizontal output circuit for providing drive signals to said horizontal output circuit; and a high voltage protection circuit responsive to said high voltage accelerating potential for coupling a disabling signal to said horizontal oscillator and driver means for disabling normal operation of said horizontal deflection circuit when said high voltage accelerating potential exceeds a predetermined value.

17. A circuit according to claim 16 wherein said horizontal output circuit includes a horizontal output transformer coupled to said horizontal deflection winding, a first secondary winding of said transformer coupled to said high voltage means.

18. A circuit according to claim 16 wherein said high voltage protection circuit comprises:

a second secondary winding coupled to said horizontal output transformer;

sensing means responsive to a voltage developed with said second secondary winding for developing a first voltage representative of at least one peak excursion of said voltage developed within said second secondary winding;

comparison means coupled to said sensing means for comparing said first voltage with a reference voltage for providing a disabling signal; and means for coupling said disabling signal to said horizontal deflection circuit.

19. A circuit comprising:

a voltage regulator responsive to a source of unregulated voltage for providing an operating voltage at an output terminal;

a deflection winding;

a deflection circuit coupled to said deflection winding for generating scanning current in said deflection winding for producing a raster, said deflection circuit including a capacitance coupled to said deflection winding for forming a resonant circuit therewith;

high voltage means coupled to said deflection circuit for providing a high voltage accelerating potential for beam current;

first means coupled to said voltage regulator for selectively changing the magnitude of said operating voltage; and second means coupled to said resonant circuit for selectively changing the resonant frequency of said resonant circuit, said first and second means combined selectively for decreasing the magnitude of said high voltage accelerating potential while maintaining a constant raster width.

20. A circuit according to claim 19 including a high voltage protection circuit and responsive to said high voltage accelerating potential for disabling normal operation of said deflection circuit when said high voltage accelerating potential exceeds a predetermined magnitude, said first and second means combined for preventing unnecessary disabling of normal operation of said deflection circuit by said high voltage protection circuit.

* * * * *

UNITED STATES PATENT AND TRADEMARK OFFICE
CERTIFICATE OF CORRECTION

PATENT NO. : 4,101,815

DATED : July 18, 1978

INVENTOR(S) : Donald Henry Willis

It is certified that error appears in the above-identified patent and that said Letters Patent is hereby corrected as shown below:

```
Col. 5, line 55, that portion reading "aid" should read
-- said --.
```

Signed and Sealed this

Eighth Day of May 1979

[SEAL]

Attest:

RUTH C. MASON
Attesting Officer

DONALD W. BANNER
Commissioner of Patents and Trademarks